United States Patent [19]

Bryant

[11] Patent Number: 4,555,807
[45] Date of Patent: Nov. 26, 1985

[54] APPARATUS AND METHOD FOR CHANNEL IDENTIFICATION

[75] Inventor: William E. Bryant, Nashua, N.H.

[73] Assignee: Sanders Associates, Inc., Nashua, N.H.

[21] Appl. No.: 520,927

[22] Filed: Aug. 8, 1983

[51] Int. Cl.⁴ .................. H04B 1/26; H04B 17/00
[52] U.S. Cl. ............................... 455/137; 455/139; 455/318; 455/313; 455/226
[58] Field of Search ............. 455/137, 226, 313, 318, 455/319, 323, 138, 139, 140; 324/77 B, 79 R; 375/10

[56] References Cited

U.S. PATENT DOCUMENTS

| | | | |
|---|---|---|---|
| 2,888,554 | 5/1959 | Hansell . | |
| 2,975,275 | 3/1961 | Adams | 455/138 |
| 3,201,692 | 8/1965 | Sichak et al. | 455/139 |
| 3,248,653 | 4/1966 | Gabor | 455/313 |
| 3,320,531 | 5/1967 | Wu . | |
| 3,401,389 | 9/1968 | Toman . | |
| 3,681,695 | 8/1972 | Cease et al. . | |
| 3,833,907 | 9/1974 | Vladimir . | |
| 4,027,247 | 5/1977 | Aranguren | 455/137 |
| 4,152,652 | 5/1979 | Taylor et al. | 455/313 |
| 4,352,210 | 9/1982 | Puckette | 455/318 |

Primary Examiner—Jin F. Ng
Attorney, Agent, or Firm—Louis Etlinger; Stanton D. Weinstein

[57] ABSTRACT

An improvement to a baseband system having a plurality of down converters feeding a single baseband receiver for assuring the same mean time to intercept while maximizing the probability of intercept as a multiband, autonomous receiver. All channels of the converter unit are operated simultaneously and a unique tag is added to the output signal from each of the down converters whereby the signal can be identified by the balance of the system as to its associated converter. In one embodiment, the tag comprises an amplitude notch appearing on the output signal at a different time following the receiver threshold being exceeded. In a second embodiment, the tag comprises a frequency step added to and/or subtracted from each output signal at the same time following the exceeding of the receiver threshold. In a third embodiment, the tag comprises a phase shift applied to the output signal.

20 Claims, 7 Drawing Figures

APPARATUS AND METHOD FOR CHANNEL IDENTIFICATION

BACKGROUND OF THE INVENTION

The present invention relates to baseband systems and, more particularly, to a method and apparatus for adding tagging to the signals from the down converters of a baseband system such that the converter unit can be operated on all channels simultaneously.

A prior art baseband system is shown in FIG. 1 in simplified form. For convenience and simplicity, only two channels are shown. The system, generally indicated as 10, comprises a first channel, generally indicated as 12, and a second channel, generally indicated as 14. The first channel 12 has a mixer 16 receiving RF signals in the 10–14 GHz range on input line 18, which signals are mixed with an 18 GHz signal from local oscillator 20. The resulting output signal from the first channel down converter 12 appears on line 22. The second channel down converter 14 operates in a similar manner, mixing 14–18 GHz signals on input line 24 with a 22 GHz signal from local oscillator 26 at mixer 28. The output from mixer 28 appears on line 30. The outputs on lines 22 and 30 pass through sequencing switch 32 which is automatically sequenced between the lines 22, 30 by switch driver 34. In a typical system with more channels of down conversion, the switch driver 34 would sequence switch 32 between the output lines from the various down converters. The output from switch 32 is the input to the single 4–8 GHz receiver 36. As will be understood, in a system such as system 10 of FIG. 1, it was necessary to continually sequence through the various converter bands in order to determine if a signal was present so that complete frequency identification could occur. The result of this approach, of course, is a low mean time to intercept and a low probability of intercept.

Wherefore, it is the object of the present invention to provide a baseband conversion system wherein the mean time to intercept is minimized and the probability of intercept is maximized.

SUMMARY

The foregoing objective has been attained by the present invention's improvement to a baseband system having a plurality of down converters feeding a single baseband receiver comprising a plurality of tag producing means operably connected to respective ones of the down converters for selectably adding a tag identifying the converter producing the signal to the output signal from each converter; and controller means operably connected to the tag producing means for adding the tags to the output signals from the converters at a recognizable time in the signal sequence. In this manner, all channels of the converter can be operated simultaneously and the resulting signals therefrom can be identified by the balance of the system according to well-recognized techniques known to those skilled in the art.

In the preferred embodiment of the invention, each of the tag producing means comprises a normally closed switch placed in line between the mixer and the local oscillator of the associated down converter whereby when the switch is opened, the local oscillator is disconnected and a tag in the form of an amplitude notch is added to the signal.

Further in the preferred embodiment, the controller means is adapted to sense the RF signal in the system and to open each of the switches for a fixed amount of time at different, pre-set times for each down converter after the converted RF signal exceeds the receiver threshold, whereby each down converter's output signal can be identified by the time delay between the threshold being exceeded and the occurrence of the amplitude notch on its output signal.

In a second embodiment, the tag comprises a frequency step added to and/or subtracted from each output signal at the same time following the exceeding of the receiver threshold. In a third embodiment, the tag comprises a phase shift applied to the output signal.

DESCRIPTION OF THE PREFERRED AND ALTERNATE EMBODIMENTS

Figure 1:
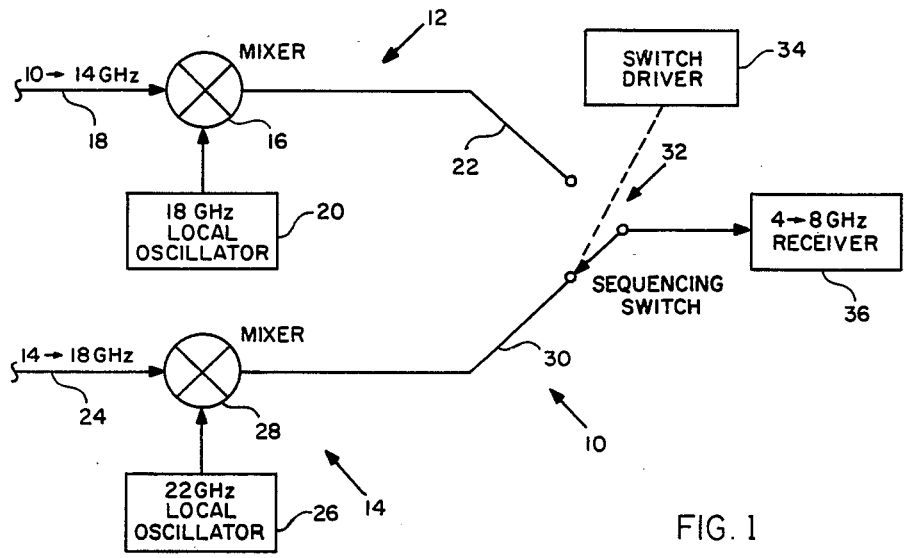
FIG. 1 is a simplified block diagram of a prior art approach to a baseband conversion system.
Figure 2:
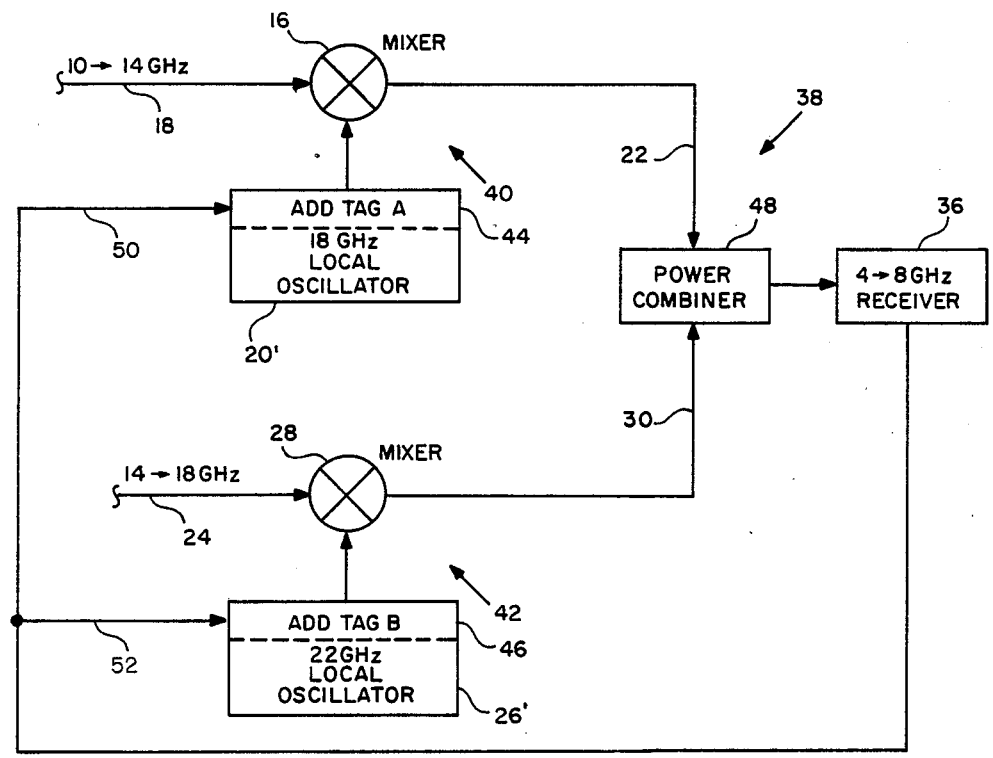
FIG. 2 is a simplified block diagram of a baseband conversion system according to the present invention.

Turning first to FIG. 2, a system according to the present invention is shown in simplified form and generally indicated as 38. As with the system of FIG. 1, only two down conversion channels are shown for simplicity. Those skilled in the art will recognize that the same technique can be applied to a plurality of channels. The first down conversion channel is generally indicated 40 and the second is generally as indicated as 42. The first channel 40 comprises a mixer 16 and a local oscillator 20' as in the first channel of the prior art system 10 of FIG. 1. Additionally, however, an "ADD TAG A" function capability 44 is added as part of the local oscillator 20'. In similar manner, second channel 42 has a mixer 28 and a local oscillator 26' with an "ADD TAG B" function capability 46 added thereto. The output lines 22 and 30 from the mixers 16, 28 are input to power combiner 48 to form a combination signal which is input to the receiver 36. The construction of power combiner 48 to perform its indicated function is well known to those skilled in the art and, accordingly, no further detail thereof is included herein to avoid redundancy and to concentrate on the portions of the system comprising the present invention.

The two "ADD TAG" function capabilities 44, 46 are controlled by signals on lines 50 and 52, respectively, from the receiver 36 in a manner to be described in greater detail hereinafter. In its basic form as heretofore described, the system 38 is adapted to add a unique tag to the signals on lines 22, 30 emerging from the mixers 16, 28 and entering the power combiner 48, such that the individual signals can be recognized as to their source by the balance of the system. Once again, the methods and apparatus to recognize a tagged signal, as will be hereinafter described in greater detail, are well known to those skilled in the art such that to avoid redundancy and simplify the specification with emphasis on those points of novelty, no further details of the aspect of detecting the tags on the signal is included herein.

Figure 3:
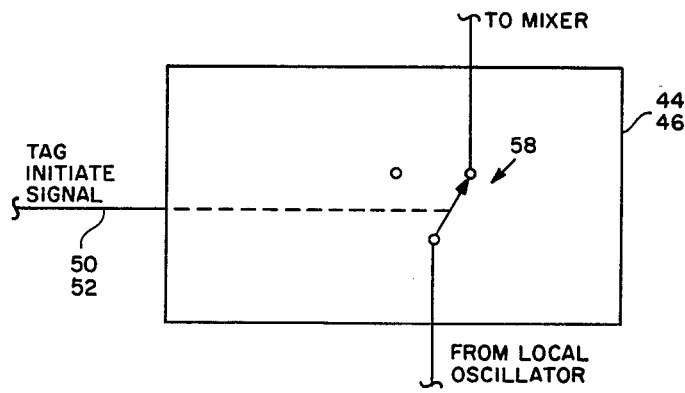
FIG. 3 is a simplified block diagram showing the tag adding block of the system of FIG. 2 in its preferred embodiment.
Figure 4:
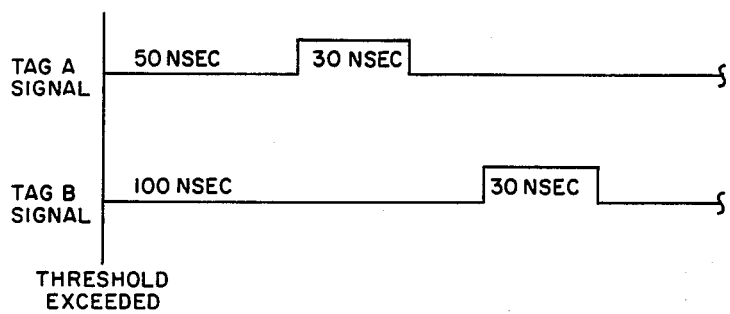
FIG. 4 is a timing diagram showing the signals provided by the control signal generator to operate the block of FIG. 3 in its preferred embodiment.

Turning now to FIGS. 3 and 4, the preferred embodiment of the present invention will be described with particularity in greater detail. The values given are, of course, only typical and can be varied according to particular needs within the scope and spirit of the present invention. Each of the "ADD TAG" function capabilities 44, 46 comprises a normally closed switch 58 disposed in line between the local oscillator 20', 26' and its associated mixer 16, 28. Upon receipt of an appropriate signal on line 50 or 52, the associated switch 58 is caused to open. Switch 58 opening removes the signal from the associated local oscillator 20', 26' resulting in an amplitude notch appearing in the received signal if arrived in the associated band of the channel. In the tested embodiment, the receiver 36 is adapted to continuously sample the RF signal. As soon as a converted RF signal exceeds the receiver threshold, timed pulses are sent on lines 50, 52 to the switches 58 (being diode switches in actual practice). These signals are shown in FIG. 4. Fifty nanoseconds after threshold crossing, the timed signal at the "ADD TAG A" function capability 44 opens the line from the 18 GHz local oscillator 20' for 30 nanoseconds, causing an amplitude notch 30 nanoseconds wide to appear in the received signal if arrived in the 10–14 GHz band. 100 nanoseconds after threshold crossing, a 30 nanosecond amplitude notch results to a signal in the 14–18 GHz band by the timed signal to the "ADD TAG B" function capability 46. To identify the frequency origin of the received signal, the receiver video need only look for an amplitude notch at 50–80 nanoseconds and at 100–130 nanoseconds.

As those skilled in the art will recognize, the two tags as presently described could be used to identify four sources according to binary usage, i.e., band A, first pulse; band B, second pulse; band C, first and second pulses; and band D, no pulse.

Figure 5:
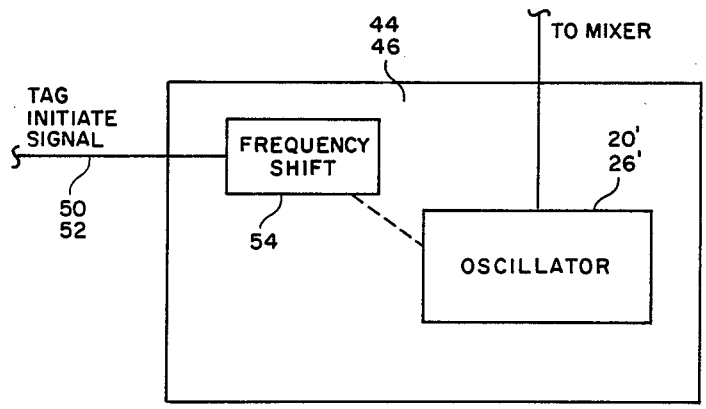
FIG. 5 is a simplified diagram of the tag adding block of FIG. 2 according to an alternate embodiment.
Figure 6:
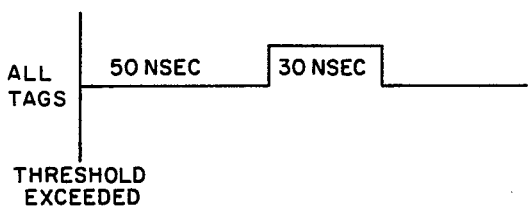
FIG. 6 is a timing diagram used to drive the block of FIG. 5.

Turning now to FIGS. 5 and 6, an alternate embodiment employing a frequency tag is shown. In this embodiment, the receiver 36 sends a common signal as shown in FIG. 6 to all the "ADD TAG" function capabilities 44, 46. The local oscillator 20', 26' is one which can be step tuned. A unique voltage step to the frequency shift initiator 54 results in a unique frequency shift in the output of the oscillator. The frequency shift for each oscillator 20', 26' is set to an identifiable amount which is different for each oscillator 20', 26'. Upon the RF signal threshold being exceeded, a common step voltage signal as shown in FIG. 6 is sent on the lines 50, 52 simultaneously for 30 nanoseconds. Each of the oscillators 20', 26' has its frequency shifted by its unique amount such that each output signal from the mixers 16, 28 has a step change in frequency impressed thereon lasting about 30 nanoseconds. Varactor tuned Gunn oscillators operating in the 18–40 GHz band can be conveniently used as the oscillators 20', 26' for this frequency tagging technique. The same frequency step technique can be used to identify which side band, upper or lower, the signal originated from; for example, a positive step in frequency resulting in a plus reading for lower side band signals and a minus reading for upper side band signals.

Figure 7:
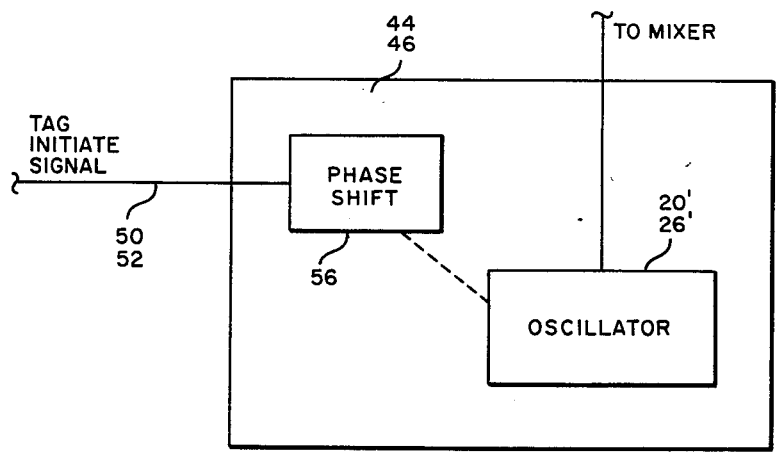
FIG. 7 is a simplified diagram of the tag adding block of FIG. 2 according to another alternate embodiment.

Another embodiment such as is shown in one embodiment in FIG. 7 can be realized by varying the latter-described embodiment. Instead of shifting the frequency of the oscillator 20', 26', the phase of the oscillator 20', 26' could also be shifted according to techniques well known to those skilled in the art. While detectable degrees of phase shift could be applied simultaneously, common phase shift tags at different times in the manner of the first embodiment described herein would probably be a more easily attainable approach technically.

Those skilled in the art will also recognize that, if desired, redundant tagging employing more than one of the above-described techniques at the same time could be employed for fail-safe operation.

Thus, from the foregoing description, it should be apparent that the system of the present invention truly attains its desired objective by allowing the baseband system to maintain all channels simultaneously active whereby the mean time to intercept is minimized and the probability of intercept is maximized.

Wherefore, having thus described my invention, I claim:

1. The improvement to a baseband system having a plurality of down converters, each capable of producing a converter output signal, each having a mixer and local oscillator with all the converters feeding a single baseband receiver, comprising:
   (a) a plurality of tag producing means operably connected to respective ones of the down converters for selectively adding a tag, identifying the converter producing an output signal, to the output signal from that converter; and
   (b) tag initiation means operably connected to said tag producing means for initiating the adding of said tags to the output signals from the converters at a time preset for each tag in response to at least one converter output signal.

2. The improvement to a baseband system of claim 1 wherein:
   each of said tag producing means comprises a normally closed switch placed in line between the mixer and the local oscillator of the associated down converter whereby when said switch is opened, the local oscillator is disconnected and a tag in the form of an amplitude notch is added to the signal.

3. The improvement to a baseband system of claim 2 wherein:
   the receiver is adapted to sense a converter output signal and to cause each of said switches to open for a fixed amount of time at different, pre-set times for each down converter after a converter output signal exceeds a preset threshold, whereby each down converter's output signal can be identified by the time delay between the threshold being exceeded and the occurrence of said amplitude notch on its output signal.

4. The improvement to a baseband system of claim 1 wherein each of said tag producing means comprises:
   (a) a step tuned local oscillator having a unique frequency shift for each down converter; and
   (b) shift producing means operably connected as part of said local oscillator for causing said oscillator to shift frequency its unique amount whereby the tag for each down converter comprises a unique, detectable step in frequency added to the output signal from each down converter.

5. The improvement to a baseband system of claim 4 wherein:

the receiver is adapted to sense a converter output signal and to activate said shift producing means for a fixed amount of time at a common, pre-set time after a converter output signal exceeds a preset threshold.

6. The improvement to a baseband system of claim 1 wherein each of said tag producing means comprises:
  (a) the local oscillator for each down converter having phase shift capability; and
  (b) shift producing means operably connected as part of said local oscillator for causing said oscillator to shift its phase a unique amount whereby the tag for each down converter comprises a unique, detectable phase shift in the frequency of the output signal from each down converter.

7. The improvement to a baseband system of claim 6 wherein:
  (a) said phase shift is different for each local oscillator, and
  (b) the receiver is adapted to sense the phase of a converter output signal and to activate said shift producing means for a fixed amount of time at a common, pre-set time after a converter output signal exceeds a preset threshold.

8. The improvement to a baseband system of claim 6 wherein:
  the receiver is adapted to sense the phase of a converter output signal and to activate each of said shift producing means for a fixed amount of time at different, pre-set times for each down converter after a converter output signal exceeds a preset threshold.

9. The improvement to a baseband system of claim 1 wherein:
  each of the down converters is adapted to receive a different RF signal.

10. The improvement to a baseband system of claim 1 wherein: the receiver detects the tags.

11. The method of operating a baseband system having a plurality of down converters, each capable of producing a converter output signal, feeding a single baseband receiver to maximize the probability of signal intercept and minimize the mean time to signal intercept, comprising the steps of:
  (a) processing at least one input signal to produce at least one converter output signal;
  (b) sensing at least one converter output signal so produced; and
  (c) in response to said sensing step, adding at a preset time to a converter output signal a tag unique to the converter producing that output signal, for identifying said converter.

12. The method of claim 11 wherein:
  each down converter comprises a mixer and a local oscillator operatively connected thereto, and
  wherein the step of adding a tag comprises the steps of:
  (a) disposing a normally closed switch in line between the mixer and the local oscillator of each down converter; and
  (b) opening the switch when a tag is desired to form the tag as an amplitude notch added to the signal.

13. The method of claim 12 wherein said step of adding a tag further includes the step of:
  opening each of the switches for a fixed amount of time at different, pre-set times for each down converter after a converter output signal exceeds a preset threshold.

14. The method of claim 11 wherein said step of adding a tag comprises the step of:
  selectively shifting the frequency of each converter output signal by a different amount to form the tag as a unique, detectable step in frequency.

15. The method of claim 14 wherein said step of adding a tag further includes the step of:
  shifting the frequency of all the local oscillators for a fixed amount of time at the same, pre-set time after a converter output signal exceeds a preset threshold.

16. The method of claim 14, wherein said selective shifting step is accomplished by a plurality of step tuned local oscillators, each of said oscillators having a unique frequency shift for each down converter.

17. The method of claim 11 wherein said step of adding a tag comprises the steps of:
  (a) employing a local oscillator having a phase shifter for each down converter; and
  (b) selectively shifting the phase of the local oscillator signal being mixed at the down converter to form the tag as a unique, detectable step change in phase.

18. The method of claim 17 wherein each local oscillator has a different phase shift and said step of adding further includes the step of:
  shifting the phase of all the local oscillators for a fixed amount of time at the same, pre-set time after a converter output signal exceeds a preset threshold.

19. The method of claim 17 wherein said step of adding a tag further includes the step of:
  shifting the phase of the local oscillators for a fixed amount of time at different, pre-set times for each down converter after a converter output signal exceeds a preset threshold.

20. The method of claim 11, further comprising: detecting the tag.

* * * * *